United States Patent
Dutta et al.

(10) Patent No.: US 11,436,052 B2
(45) Date of Patent: Sep. 6, 2022

(54) SHARED RESOURCE OPERATIONAL METRIC

(71) Applicant: Hewlett Packard Enterprise Development LP, Houston, TX (US)

(72) Inventors: Mayukh Dutta, Bangalore Karnataka (IN); Manoj Srivatsav, Bangalore Karnataka (IN); Aesha Dhar Roy, Bangalore Karnataka (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/865,716

(22) Filed: May 4, 2020

(65) Prior Publication Data
US 2020/0394073 A1 Dec. 17, 2020

(30) Foreign Application Priority Data
Jun. 17, 2019 (IN) .............................. 201941024016

(51) Int. Cl.
*G06F 3/00* (2006.01)
*G06F 9/50* (2006.01)
*G06F 30/27* (2020.01)

(52) U.S. Cl.
CPC ............ *G06F 9/5011* (2013.01); *G06F 30/27* (2020.01)

(58) Field of Classification Search
CPC .................................. G06F 30/27; G06F 9/54
USPC ........................................................ 719/310
See application file for complete search history.

(56) References Cited

U.S. PATENT DOCUMENTS

| | | | |
|---|---|---|---|
| 8,479,214 B2 | 7/2013 | Green et al. | |
| 8,732,368 B1* | 5/2014 | Jouppi | G06F 12/0862 710/240 |
| 9,215,142 B1 | 12/2015 | Herold et al. | |
| 9,542,346 B2* | 1/2017 | Hrischuk | G06F 11/3452 |
| 9,772,792 B1 | 9/2017 | Wallner et al. | |
| 2012/0191630 A1* | 7/2012 | Breckenridge | G06N 20/00 706/12 |
| 2012/0239376 A1* | 9/2012 | Kraft | G06F 11/3476 703/22 |
| 2014/0215077 A1 | 7/2014 | Soudan et al. | |
| 2019/0324799 A1* | 10/2019 | Metsch | G06F 9/4881 |
| 2019/0334786 A1 | 10/2019 | Dutta et al. | |
| 2020/0233598 A1* | 7/2020 | Bezugly | G06F 3/068 |

OTHER PUBLICATIONS

Qingchen Zhang, An Efficient Deep Learning Model to Predict Cloud Workload for Industry Informatics. (Year: 2018).*
Edgar Simo-Serra, Mastering Sketching: Adversarial Augmentation for Structured Prediction. (Year: 2018).*

(Continued)

*Primary Examiner* — Lechi Truong
(74) *Attorney, Agent, or Firm* — Trop, Pruner & Hu, P.C.

(57) ABSTRACT

In some examples, using a model generated from an aggregation of parameter values for a plurality of host systems, a system predicts an operational metric representing usage or performance of a shared resource due to a requester in a first host system of the plurality of host systems, the shared resource being outside of the plurality of host systems.

18 Claims, 6 Drawing Sheets

(56) References Cited

OTHER PUBLICATIONS

BhaskarGM, "Get ahead of performance bottlenecks with HPE InfoSight Performance Insights for 3PAR", HPE, available online at <https://community.hpe.com/t5/HPE-Storage-Tech-Insiders/Get-ahead-of-performance-bottlenecks-with-HPE-InfoSight/ba-p/7025975#.XGuVV8995QI>, Nov. 27, 2018, 12 pages.

John Matson, "How to monitor Microsoft Azure VMs", available online at datadoghq.com/blog/how-to-monitor-microsoft-azure-vms/>, Aug. 13, 2015, 6 pages.

NetApp, Inc., "OnCommand® Insight 6.4", OnCommand Insight Performance Guide, Mar. 2013, 142 pages.

Soundararajan et al., "StatsFeeder: An Extensible Statistics collection Framework for Virtualized Environments", VMware Technical Journal, available online at <https://web.archive.org/web/20150505120751/https://labs.vmware.com/vmtj/statsfeeder-an-extensible-statistics-collection-framework-for-virtualized-environments>, May 5, 2015, 27 pages.

Matson, J., "How to Monitor Microsoft Azure VMs," (Web Page), Aug. 13, 2015, datadoghq.com/blog/how-to-monitor-microsoft-azure-vms/>.

SolarWinds Worldwide, LLC, "SolarWinds Orion Platform Products vs. Ipswitch WhatsUp Gold TotalView Plus Edition 2017," Apr. 2018, also.com/ec/cms5/media/documents/1010_anbieter/solarwinds_2/solarwinds_ncm_vs_swhatsupgold.pdf>.

SolarWinds Worldwide, LLC, "Virtualization Management Software with Virtualization Manager," Oct. 1, 2019, <https://web.archive.org/web/20191001160553.solarwinds.com/virtualization-manager/use-cases/virtualization-management-software>.

SolarWinds Worldwide, LLC, "Virtualization Manager," May 5, 2019, <https://web.archive.org/web/20190505004737/https://www.solarwinds.com/virtualization-manager>.

SolarWinds Worldwide, LLC, "VM Sprawl Control with Virtualization Manager," Oct. 28, 2017, <https://web.archive.org/web/20171028125208.solarwinds.com/topics/vm-sprawl-control>.

SolarWinds Worldwide, LLC, Excerpts from "Optimizing VM Resources," Virtualization Manager Version 8.2 Administrator Guide, Mar. 27, 2018, pp. 29-41 and 68-73, solarwinds.com/-/media/solarwinds/swdcv2/licensed-products/virtualization-manager/resources/product-guides/vmanv82administratorguide.ashx?rev=f071c1a960204709be13a8a4e0f45d24&hash=AD250F63-A339A9D2E3C54DB7FCO8EC83>.

Stan Yanitskiy, "VM Analytics now available in Purel®, " Sep. 20, 2018, <https://blog.purestorage.com/products/vm-analytics-now-available-in-pure1/>.

\* cited by examiner

SHARED RESOURCE OPERATIONAL METRIC

BACKGROUND

An arrangement of storage devices can be used to store data. Requesters can issue requests to access data stored at the storage devices. The requests submitted by the requesters result in workloads at a storage system that controls access of the storage devices.

BRIEF DESCRIPTION OF THE DRAWINGS

Some implementations of the present disclosure are described with respect to the following figures.

Figure 1:
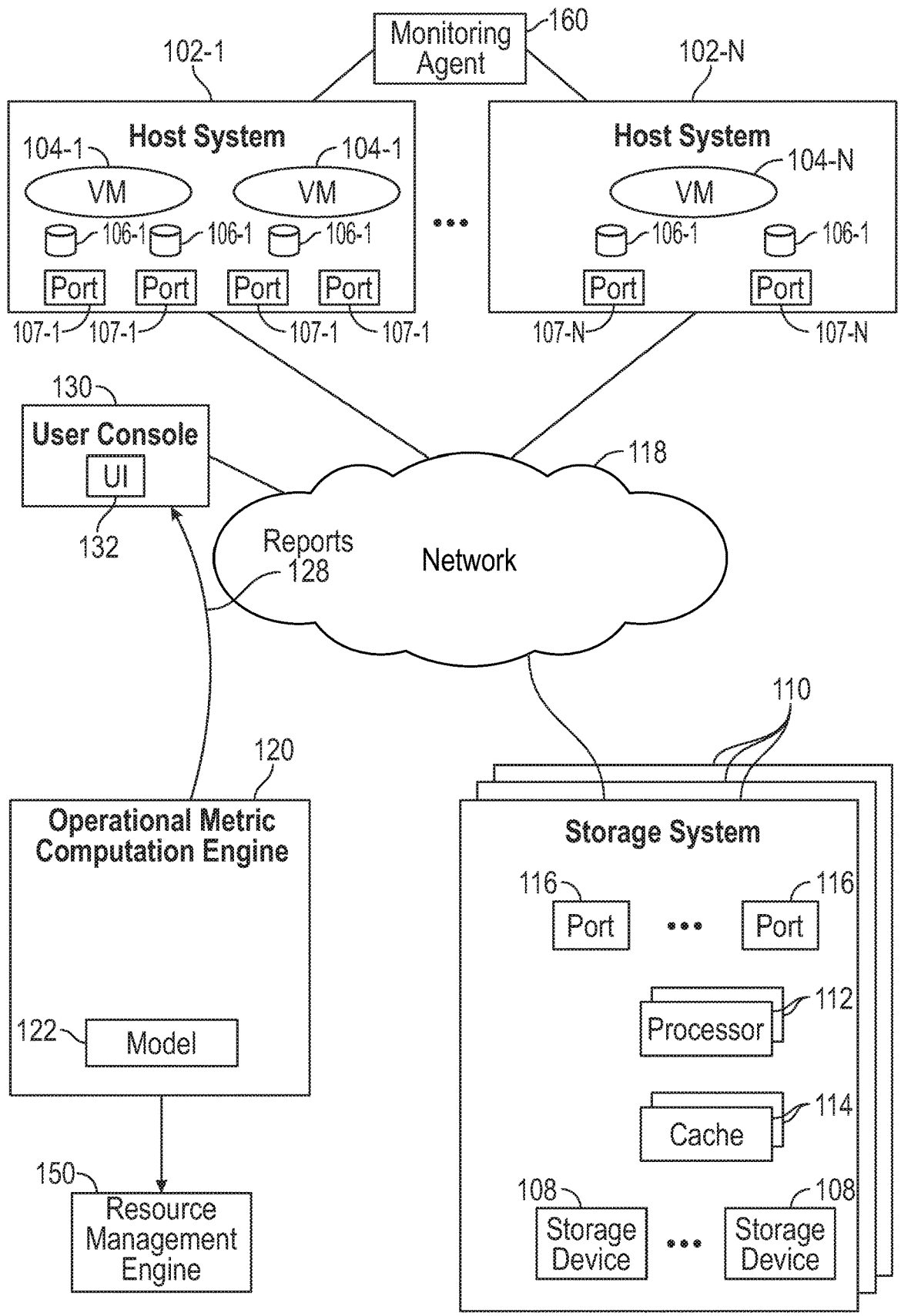
FIG. 1 is a block diagram of an arrangement that includes host systems, storage systems, and an operational metric computation engine, according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

A "storage system" can refer to a platform including hardware and machine-readable instructions to implement storage of data. A storage system can be implemented using a combination of processing resources, memory resources, and communication resources.

A processing resource can include a processor, multiple processors, or a portion (e.g., a core or multiple cores) of a processor. A memory resource can include a memory device or multiple memory devices, such as a dynamic random access memory (DRAM), a static random access memory (SRAM), and so forth. An example of a memory resource is a cache memory to temporarily store data that is held in a persistent storage. A communication resource can include a network interface controller (or a portion thereof) or a port that is used to communicate over a network. In further examples, a storage system can include other resources, including physical resources and/or virtual resources.

A storage system can include or have access to a storage device (or multiple storage devices). A "storage device" can include persistent storage implemented using nonvolatile storage device(s), such as disk-based storage device(s) (e.g., hard disk drive(s) (HDD(s)), or the like), solid state storage device(s) (e.g., solid state drive(s) (SSD(s)), or the like), and so forth.

Requesters can issue requests for accessing data stored in storage devices. Such requests result in workloads being performed by the storage system. A "workload" can refer to a collection of activities in response to a request(s) of a corresponding requester(s).

Requesters can be included in host systems. A "host system" can refer to a platform that includes hardware and machine-readable instructions and that is capable of issuing requests, such as from a requester in the host system, to access (read and/or write) data of a storage system.

An example of a requester is a program (e.g., an application program, an operating system, firmware) that includes machine-readable instructions. As another example, a requester can include a virtual machine, which provides a virtualized environment within a physical machine in which machine-readable instructions can execute. A further example of a requester includes a storage volume, which can refer to a logical unit of storage (e.g., a virtual volume having a virtual address range) to which storage locations in physical storage (e.g., storage device(s) in storage array(s), or portions thereof) may be allocated for storage of data. Storage volumes can be presented to host system(s) that can read and write data of the storage volumes. For example, a storage volume can be exported by a storage system to a host system, for use by the host system. More generally, a storage volume can be made available to the host system so that the host system can access data in the storage volume. An access of data in the storage volume of a host system causes a corresponding request to be issued to a storage system to access the underlying data from a storage device(s).

Because there may be multiple requesters in respective host systems that access data via a storage system, it may be difficult to determine how usage or performance of a shared resource outside of the host systems is attributable to an individual requester (or a subset of requesters less than all of the requesters in the host systems). The shared resource is "outside" of the host systems in that the shared resource is not a resource that is part of any of the host systems. Examples of shared resources outside of the host systems include a resource within the storage system or a communication path connecting the storage system to a host system.

Requests from the multiple requesters can cause input/output (I/O) operations to consume a shared resource. An "I/O operation" can refer to an operation related to access (read access and/or write access) of data. Due to the blending of I/O operations from different requesters at a shared resource, it can be difficult to determine the individual contribution of any individual requester (or subset of requesters) to the usage or performance of the shared resource.

FIG. 1 shows an example environment that includes host systems 102-1 to 102-N, where N≥2. Requesters in the host systems 102-1 to 102-N can issue requests to access data stored by storage devices 108 of a storage system 110 (or multiple storage systems 110). The storage devices 108 can be implemented using disk-based storage devices, solid state memory devices, and/or other types of persistent storage devices. The storage devices 108 can be arranged as an array (or multiple arrays) of storage devices.

Although FIG. 1 shows the storage devices 108 as being part of the storage system 110, in other examples, the storage devices 108 may be external of but accessible by the storage system 110.

The environment of FIG. 1 can be divided into a host side and a storage side. The host side includes the host systems 102-1 to 102-N, and the requesters and resources within the host systems. The storage side includes the storage system(s) 110 and the communication paths between the storage system(s) 110 and the host systems 102-1 to 102-N. Shared resources on the storage side can include the communication paths and resources within the storage system 110. The shared resources are consumed by I/O operations responsive to requests from the requesters in the host systems 102-1 to 102-N.

In accordance with some implementations of the present disclosure, an operational metric computation engine 120 can determine a correlation between parameter values associated with I/O operations at the host side and operational metrics relating to usage or performance of shared resources at the storage side.

As used here, an "engine" or can refer to a hardware processing circuit, which can include any or some combination of a microprocessor, a core of a multi-core microprocessor, a microcontroller, a programmable integrated circuit, a programmable gate array, a digital signal processor, or another hardware processing circuit. Alternatively, an "engine" can refer to a combination of a hardware processing circuit and machine-readable instructions (software and/or firmware) executable on the hardware processing circuit.

The operational metric computation engine 120 can be part of the storage system 110, or alternatively, can be separate from the storage system 110 and coupled to a network 118. Examples of the network 118 can include any or some combination of the following: a storage area network (SAN), a local area network (LAN), a public network such as the Internet, and so forth.

In some examples, the correlation between parameter values associated with I/O operations at the host side and operational metrics relating to usage or performance of shared resources at the storage side is determined by the operational metric computation engine 120 based on a machine learning model 122.

The parameter values associated with I/O operations at the host side can be collected by a monitoring agent 160 that can run in a host system, or that can be outside of the host system but in communication with the host system to allow the monitoring agent 160 to collect the parameter values associated with I/O operations at the host side. In examples where the monitoring agent 160 is included in each host system, multiple instances of the monitoring agent are provided in the respective host systems.

The machine learning model 122 can be generated from an aggregation of parameter values for multiple host systems. Although the machine learning model 122 is generated based on the aggregation of parameter values for multiple host systems, the machine learning model 122 can be used to predict an operational metric (i.e., a single operational metric or multiple operational metrics) representing usage or performance of a shared resource or multiple shared resources (outside of the host systems 102-1 to 102-N) due to request(s) from a requester (either an individual requester in a host system, or a subset of requesters in a host system or multiple host systems).

Resource performance and/or usage can be expressed using a number of operational metrics, any of which can be computed using the machine learning model 122. The operational metrics can include usage metrics, which represent usage of a resource, and/or performance metrics, which represent how well the resource is performing. Examples of operational metrics include any or some combination of the following: an input/output (I/O) count (that counts a number of I/O requests such as read and write requests), a ratio between read requests and write requests, a cache hit percentage (a percentage of requests that can be satisfied from a cache memory), processor usage, processor saturation (that indicates an amount of a processor that is consumed due to usage of the processor by workloads), cache saturation (that indicates an amount of a cache that is consumed due to usage of the cache by workloads), persistent storage saturation (that indicates an amount of a persistent storage that is consumed due to usage of the persistent storage by workloads), port saturation (that indicates a bandwidth of a port that is consumed due to usage of the port by workloads), queue depth (an amount of a queue storing data), a size of an I/O operation, a measure of a processor being busy, latency (which indicates a length of time associated with a response of the resource to a request, or a length of time associated with communication of data), and so forth.

As noted above, the machine learning model 122 is generated (e.g., built, trained, updated, etc.) based on an aggregation of parameter values for multiple host systems (from among the host systems 102-1 to 102-N). "Parameter values" can refer to values of a parameter (or of multiple parameters). Parameters can describe characteristics of workloads performed in response to requests from requesters in the host systems 102-1 to 102-N.

Examples of parameters that describe characteristics of a workload can include an input/output (I/O) size of a respective I/O operation associated with the workload, a count of a number of I/O operations of a respective I/O size, and a type of a respective I/O operation (e.g. a read operation, a write operation, etc.).

Although example parameters that represent a workload are listed, it is noted that in other examples, additional or alternative parameters can be used to represent characteristics of a workload.

A I/O operation of a particular I/O size refers to an I/O operation that accesses (reads or writes) data of the particular I/O size, e.g., data having a 4-kilobits (kb) size, an 8-kb size, a 16-kb size, a 32-kb size, and so forth. A count of a number of I/O operations of a particular I/O size refers to a quantity of the I/O operations of the particular I/O size. Types of requests can include a write request (a first type of request), a read request (a second type of request), and so forth.

A given workload may be associated with multiple I/O operations of different characteristics (e.g., I/O sizes, request types, etc.). For example, the given workload may be associated with multiple I/O operations of different I/O sizes.

Generally, a given workload can be represented by a collection of buckets, where each bucket includes quantities of I/O operations of a respective different characteristic. For example, a first bucket can include a quantity of I/O operations of a first I/O size, a second bucket can include a quantity of I/O operations of a second I/O size different from the first I/O size, and so forth. The different buckets that represent the given workload can be in the form of a histogram (or any other representation) that includes the buckets at corresponding intervals, such as time intervals.

In the ensuing discussion, a bucket representing I/O operations can refer to a bucket that includes a quantity of I/O operations.

Aggregating parameter values for multiple host systems can refer to aggregating histograms (or other representations) of buckets representing I/O operations for the corresponding host systems. For example, a first host system can be associated with a first histogram (or other representation) of buckets representing I/O operations of different characteristics, a second host system can be associated with a second histogram (or other representation) of buckets representing I/O operations of different characteristics, and so forth. Aggregating the histograms (or other representations) can refer to summing, averaging, or performing another mathematical aggregation of the histograms (or other representations) of buckets representing I/O operations.

In further examples, aggregating parameter values can also refer to computing an aggregate of multiple parameter values, such as an aggregate I/O size of I/O operations of the multiple host systems, an aggregate count of I/O operations for the multiple host systems, and so forth. An aggregate I/O size can refer to an average I/O size that is an average of the I/O sizes of I/O operations from the multiple host systems, a sum of I/O sizes, or any other mathematical aggregate of I/O sizes. Similarly, an aggregate count value can refer to an average count of the I/O operations of each respective I/O size for the multiple host systems, a summed count, or any other aggregated count.

Although the machine learning model 122 is generated based on an aggregation of parameter values for multiple host systems, the operational metric computation engine 120 can use the machine learning model 122 to compute an operational metric that represents usage and/or performance of a shared resource (which can refer to a single shared resource or a collection of shared resources) due to requests from a requester in a host system (which can refer to one requester in one host system or to a subset of requesters and one host system or multiple host systems).

In this manner, the machine learning model 122 does not have to be trained using parameter values for respective individual requesters or subsets of requesters, which can be hard to do since I/O operations due to individual requesters may be blended at a shared resource outside of a host system. Thus, usage or performance of a shared resource can be due to workloads for multiple requesters.

An example of the machine learning model 122 is a regression model or another type of model. The machine learning model 122 can be adjusted based on training data. A regression model is a model that relates multiple variables of interest, where the variables can include an output variable(s) such as an operational metric(s) relating to a performance or usage of a resource of the storage system, and an input variable(s), such as operational metric data collected at a host system or multiple host systems. Training a model using training data can use any of various different machine learning techniques.

In the example of FIG. 1, the host system 102-1 includes VMs 104-1 and storage volumes 106-1 that are presented to the host system 102-1. The host system 102-N includes a VM 104-N and storage volumes 106-N that are presented to the host system 102-N. The VMs 104-1 in the host system 102-1 are able to access data of the storage volumes 106-1, and the VM 104-N is able to access data of the storage volumes 106-N in the host system 102-N.

In other examples, instead of or in addition to VMs, other types of entities in the host systems 104-1 to 104-N that are able to access data include a program, such as an application program, an operating system, a firmware, or other machine-readable instructions.

As described above, a storage volume is a logical unit of storage (e.g., a virtual volume having a virtual address range) to which storage locations in physical storage (e.g., storage device(s) in storage array(s), or portions thereof) may be allocated for storage of data. Each storage volume is useable by the VMs or other entities in the host systems 102-1 to 102-N to access data. Storage volumes can be presented to host system(s) that include(s) entities that can read and write data of the storage volumes. A storage volume can be made available to the host system so that the host system (or more specifically, an entity in the host system) can access data in the storage volume. The underlying data that can be accessed using the storage volumes are stored in the storage devices 108 accessible by the storage system(s) 110.

Each storage system 110 includes processors 112 and cache memories 114. The processors 112 can execute a data access program (in the form of machine-readable instructions) that manage access of data stored in the storage devices 108 in response to requests received from a requester based on access of a storage volume (or multiple storage volumes) by the requester. A cache memory 114 can be used to temporarily store data, such as write data to be written to the storage devices 108, or read data retrieved from a storage device 108.

The storage system 110 further includes various storage ports 116. A "port" can refer to a communication interface (either a physical interface or a logical interface) through which a host system 102-i (i=1 to N) is able to access the storage system 110 over the network 118.

Each storage port 116 has a corresponding bandwidth that can be used to communicate data in response to data access requests from requesters.

The host systems 102-1 and 102-N each also include host ports for communication over the network 118 with corresponding storage ports of the storage system 110. The host system 102-1 includes host ports 107-1, and the host system 102-N includes host ports 107-N. Communication paths can be established between the host ports 107-i (i=1 to N) and the storage ports 116 over the network 118.

The storage ports 116, the processors 110, the cache memories 112, the storage devices 108, and the communication paths between the host ports and storage ports are examples of shared resources on the storage side that can be used to perform tasks associated with access of storage volumes by respective requesters.

The host ports 107-1 and 107-N, the storage ports 116 and the communication paths are examples of communication resources. The processors 110 are examples of processing resources. The cache memories 112 are examples of memory resources. The storage devices 108 are examples of storage resources.

Operational metric(s) computed by the operational metric computation engine 120 using the machine learning model 122 can be included in reports 128 sent to a user console 130 over the network 118. Information in the reports 128 can be displayed in a user interface (UI) 132 by the user console 130.

A user console can refer to an electronic device, such as a desktop computer, a notebook computer, a tablet computer, a smartphone, and so forth. In further examples, there may be multiple user consoles 230.

In some examples, the reports 128 can include information that represents relative contributions of different individual requesters (or subsets of requesters) to a usage or operation of a shared resource. For example, such information can be presented in the form of a treemap (discussed further below), or in another format.

In further examples, the operational metric(s) computed by the operational metric computation engine 120 can be transmitted to a resource management engine 150. The resource management engine 250 can automatically perform any of various actions in response to operational metric(s) from the operational metric computation engine 120.

Figure 2:
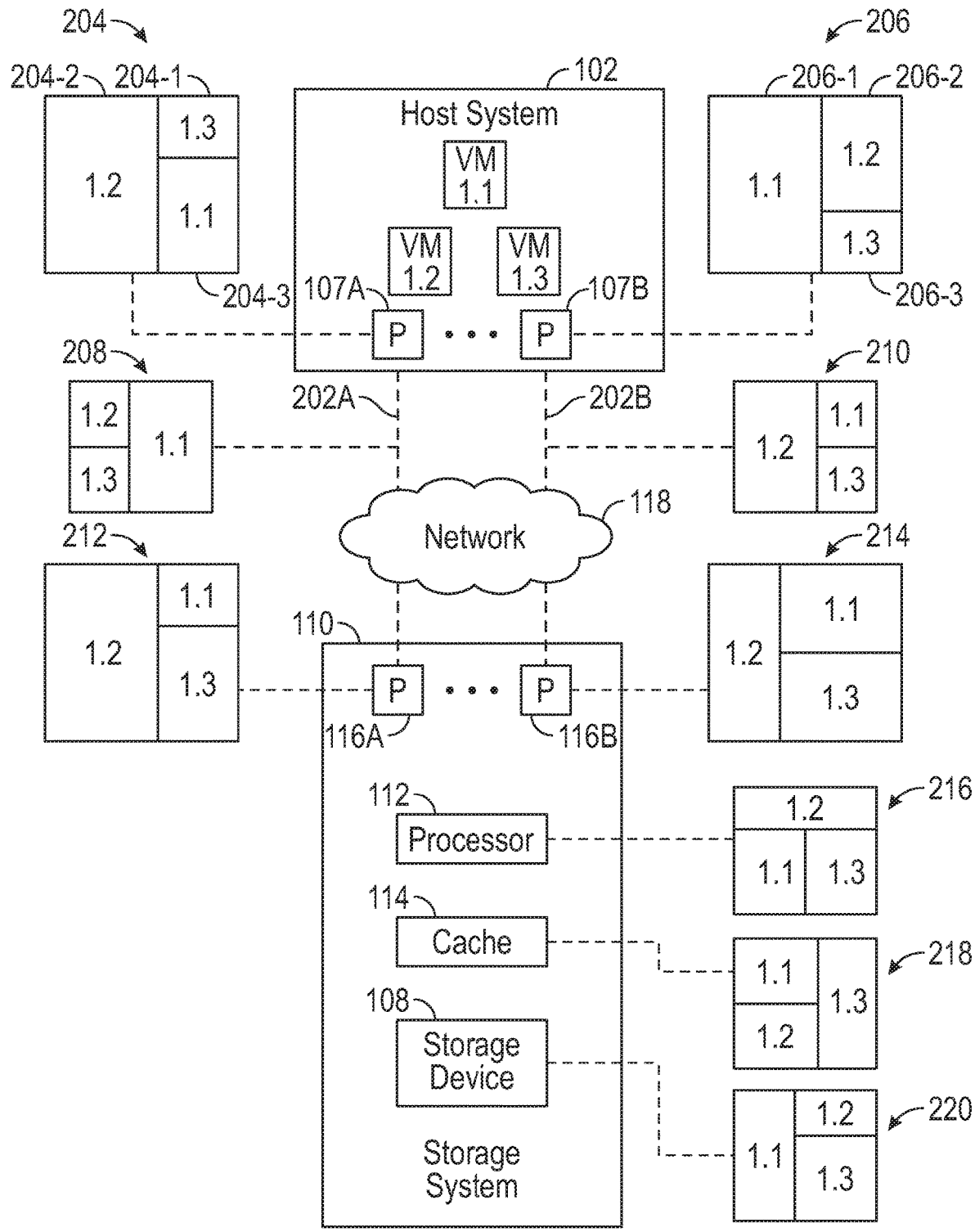
FIG. 2 is a block diagram showing various example visualizations for operational metrics computed according to some examples.

Examples of actions that can be taken by the resource management engine 150 in response to operational to operational metric(s) include any or some combination of the following: throttling usage of a resource by a requester (such as by reducing a rate at which data requests from the requester are submitted to a storage system for data of a collection of storage volumes corresponding to the workload); configuring a quality of service (QoS) setting for the requester, where the QoS setting can affect a priority of the requester in usage of the resource; changing an allocation of the resource to the requester (such as by changing an amount of the resource allocated to handle data accesses of the data by the requester); and so forth FIG. 2 is a block diagram of an arrangement that includes a host system 102, the network 118, and the storage system 110. FIG. 2 also shows visualizations of operational metrics of various resources. In the example of FIG. 2, the host system 102 includes several VMs, including VM 1.1, VM 1.2, and VM 1.3. The host system 102 also includes various host ports 107A and 107B, and the storage system 110 includes various storage ports 116A and 116B. Multiple respective communication paths 202A and 202B can be established between the host ports 107A, 107B and the corresponding storage ports 116A, 116B through the network 118.

A visualization can be used to represent operational metrics associated with different requesters for a shared resource. In some examples, the visualization can be in the form of a treemap. In other examples, other types of visualizations can be used, including any type of graphical visualization or textual visualization.

A treemap is a hierarchical representation of data as a set of nested rectangles, where each branch of a tree is represented by a rectangle, and then within each rectangle, smaller rectangles can represent sub-branches of the tree. For example, a root of the tree can represent a host system, and sub-nodes connected from the root can represent respective requesters in the host system.

In FIG. 2, a treemap 204 includes a rectangle 204-2 that represents an operational metric associated with a usage or operation of the host port 107A contributed by VM 1.2 (i.e., due to I/O operations caused by requests of VM 1.2). Other rectangles 204-1 and 204-3 in the treemap 204 represent operational metrics associated with a usage or operation of the host port 107A contributed by VMs 1.1 and 1.3, respectively. The area of each rectangle 204-1, 204-2, or 204-3 is based on a value of the operational metric computed by the operational metric computation engine 120.

In examples where treemaps are used, the rectangles within a treemap are examples of visual indicators having respective characteristics based on the operational metrics for respective requesters.

For example, the operational metric that is represented can include a saturation of the host port 107A. Thus, a larger area of a rectangle in the treemap 204 would indicate a higher saturation of the host port 107A due to I/O operations of the respective VM. In the example of FIG. 2, the treemap 204 indicates that VM 1.2 contributes the most (as compared to VMs 1.1 and 1.3) to the saturation of the corresponding host port 107A represented by the treemap 204.

In other examples, the operation metric can include a latency, a usage percentage, and so forth.

FIG. 2 further shows another treemap 206, which includes various rectangles 206-1, 206-2, and 206-3 representing respective saturation levels of the host port 107B due to I/O operations of VMs 1.1, 1.2, and 1.3, respectively. Similar treemaps 208 and 210 can be used to represent saturation levels of respective communication paths 202A and 202B contributed by VMs 1.1, 1.2, and 1.3

Treemaps 212 and 214 show saturation levels of storage ports 116A and 116B, respectively, contributed by VMs 1.1, 1.2, and 1.3.

FIG. 2 shows further treemaps 216, 218, and 220 that indicate saturation levels contributed by VMs 1.1, 1.2, and 1.3 of the processor 112, cache memory 114, and storage device 108, respectively.

In the example of FIG. 2, it can be observed that for storage port 116A, VM 1.2 is mostly responsible for saturation of the storage port 116A. Relative contributions of VMs 1.1, 1.2, and 1.3 to saturations of various shared resources can be observed using the other treemaps shown in FIG. 2.

The treemaps are examples of visualizations that can be displayed in the UI 132 of the user console 130 of FIG. 1. An administrator is able to view the treemaps and make a decision on actions to take based on the treemaps, including upgrading storage systems, replacing storage systems, migrating data from one storage system to another storage system, and so forth.

The following describes details relating to computing operational metrics of various shared resources, including a host port, a storage port, a communication path between a host port and a storage port, a resource within a storage system, and so forth.

In some cases, the operational metrics can be computed using the machine learning model 122. In other cases, the operational metrics can be based on a different technique.

An example of computing operational metrics for a host port, a storage port, and a communication path that does not employ the machine learning model 122 is provided below.

If the number of I/O operations observed at a host port HP1 in a host system due to requests from a virtual machine VM1 is N1, the average I/O size of the I/O operations from VM1 observed at host port HP1 is S1, and the total bandwidth of the host port HP1 is $B_H$ (which can be based on specification information provided by a device manufacturer, for example), then the saturation of host port HP1 due to activities of VM1 can be represented as:

$$\text{Saturation } (VM1, HP1) = \frac{N1 \cdot S1}{B_H}. \quad \text{(Eq. 1)}$$

The values of N1 and S1 for host port HP1 can be collected by a monitoring agent (e.g., 160 in FIG. 1) coupled to the host system.

The foregoing provides an example of computing an operational metric for a shared resource at the host side, i.e., at a host port in a host system.

A similar technique can be used to compute the saturation of a storage port 116 of the storage system 110 for each VM. In some examples, it is assumed that there is a one-to-one connection of a host port to a storage port, i.e., each host port is connected to just one storage port. In this scenario, the values of N1 and S1 collected for the host port HP1 are also applicable to the storage port 116 that is connected to the host port HP1.

Thus, the saturation of a storage port SP1 due to activities of VM1 can be represented as:

$$\text{Saturation }(VM1, SP1) = \frac{N1 \cdot S1}{B_S}, \quad \text{(Eq. 2)}$$

where $B_S$ represents the bandwidth of the storage port SP1.

Once the saturation of the host port HP1 and the saturation of the corresponding storage port SP1 to which the host port HP1 is connected are computed, then the saturation of a communication path (e.g., 202A or 202B in FIG. 2) between the host port HP1 and the storage port SP1 can be computed simply as the average (or other aggregate of the saturation of the host port HP1 and the saturation of the storage port SP1 due to VM1.

In other examples, the saturation or other operational metric of a storage port 116 and a communication path between a storage port and a host port can be computed using the machine learning model 122.

The saturation or other operational metric of shared resources (e.g., 112, 114, 108) within the storage system 110 can also be computed using the machine learning model 122.

The machine learning model 122 can be trained using an aggregation of histogram data for multiple host systems. Note that the histogram data for individual VMs is not available. Thus, although the goal is to use the machine learning model 122 to estimate operational metrics for individual VMs (or subsets of VMs), the histogram data for individual VMs or subsets of VMs is not available for training the machine learning model 122. In accordance some implementations of the present disclosure, the machine learning model 122 trained using an aggregate of histogram data for multiple host systems can be applied to compute an operational metric for a shared resource on the storage side reflecting usage or performance of the shared resource due to I/O operations of an individual VM or subset of VMs.

Figure 3:
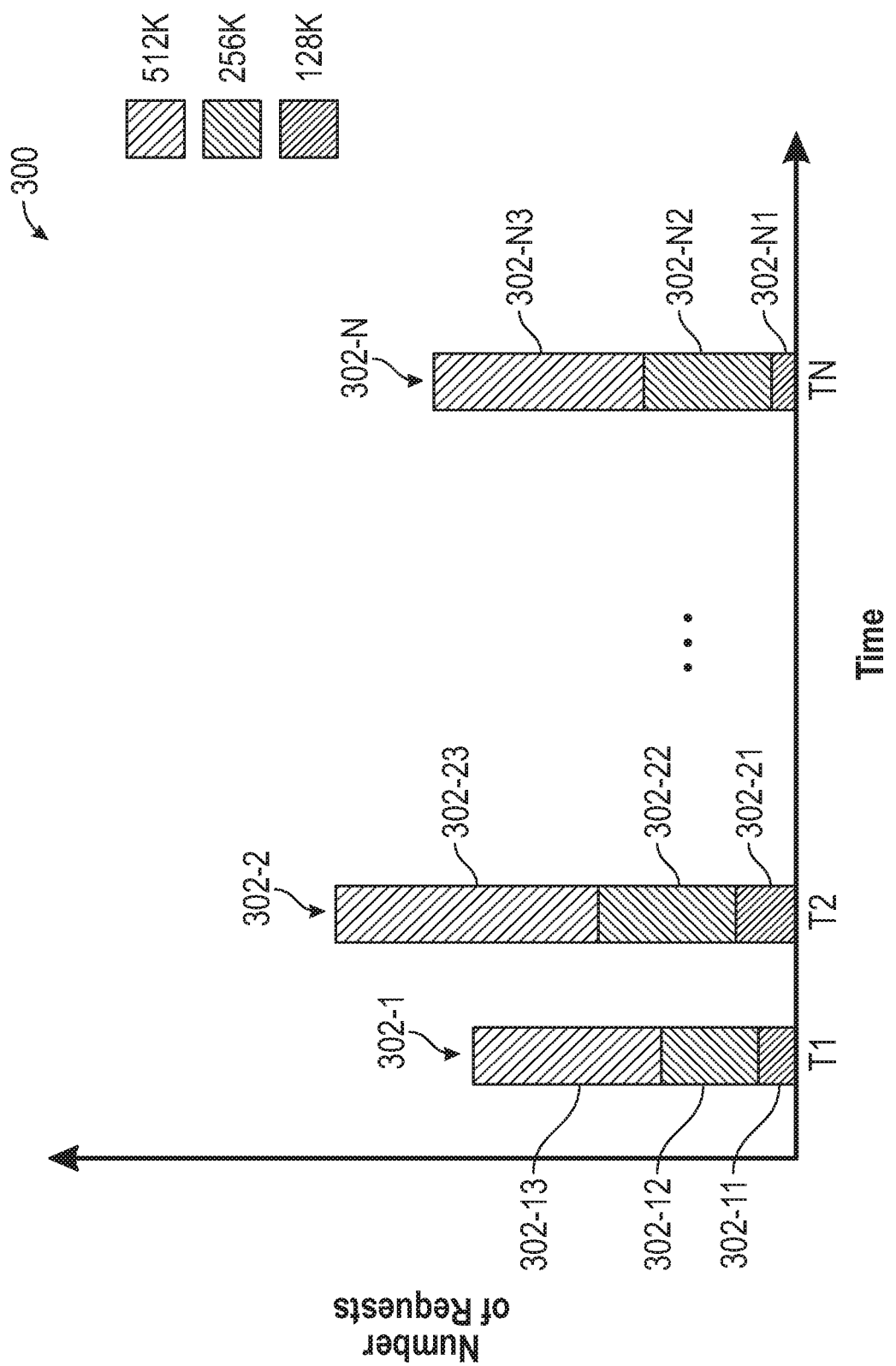
FIG. 3 shows a histogram of buckets of a workload according to some examples.

FIG. 3 shows an example histogram 300 of buckets representing quantities of requests of different I/O sizes. In the example histogram 300, the horizontal axis represents time, and the vertical axis represents a number (quantity) of requests. The histogram 300 includes multiple bars 302-1, 302-2, ..., 302-N(N≥2). Each bar 302-$i$ (i=1 to N) is divided into multiple bar segments, and each bar segment represents a bucket representing a quantity of requests of a respective I/O size (or other characteristic) at a particular time interval. In the example of FIG. 3, different patterns of each bar segment represent respective different I/O sizes, such as 128 kb, 256 kb, and 512 kb. For example, the bar 302-1 at time interval T1 is divided into bar segments 302-11, 302-12, and 302-13 that represent respective buckets representing quantities of requests of corresponding different I/O sizes at time interval T1. The bar segment 302-11 represents a bucket representing a quantity of 128-kb requests (i.e., a quantity of requests that cause data of 128-kb size to be read or written) at time interval T1, the bar segment 302-12 represents a bucket representing a quantity of 256-kb requests at time interval T1, and the bar segment 302-13 represents a bucket representing a quantity of 512-kb requests at time interval T1. The length of each bar segment provides an indication of the number of requests of the respective I/O size represented by the bar segment.

Although three I/O sizes are depicted in FIG. 3, it is noted that a different example can represent requests of additional or alternative I/O sizes.

Similarly, the bar 302-2 at time interval T2 is divided into respective bar segments 302-21, 302-22, and 302-23 representing respective buckets representing requests of different I/O sizes at time interval T2, and the bar 302-N at time interval TN is divided into respective bar segments 302-N1, 302-N2, and 302-N3 representing respective buckets representing requests of different I/O sizes at time interval TN.

Note that the example histogram 300 is based on I/O operations for an entire host system, which can include multiple requesters, as observed at a particular host port. Thus, the histogram 300 represents I/O operations of a particular combination of a host system and a host port within the host system.

Figure 4A:
FIGS. 4A-4C show examples of using models to compute operational metric values, according to some examples.

FIG. 4A shows an example where a histogram, Histogram (H1, HP1) for host H1 and host port HP1 (in host H1) is input into a model 400. The model 400 produces, in response to Histogram(H1, HP1), a saturation value S_H1_HP1, which represents the saturation of a shared resource within the storage system 110 due to I/O operations from the host port HP1 in the host system H1.

Similar histograms for other ports of the host system H1 and other ports of other host systems can be applied to the model 400 to produce respective saturation values S_Hx_HPy, where Hx represents host system x, and HPy represents host port y in host system x.

Figure 4B:
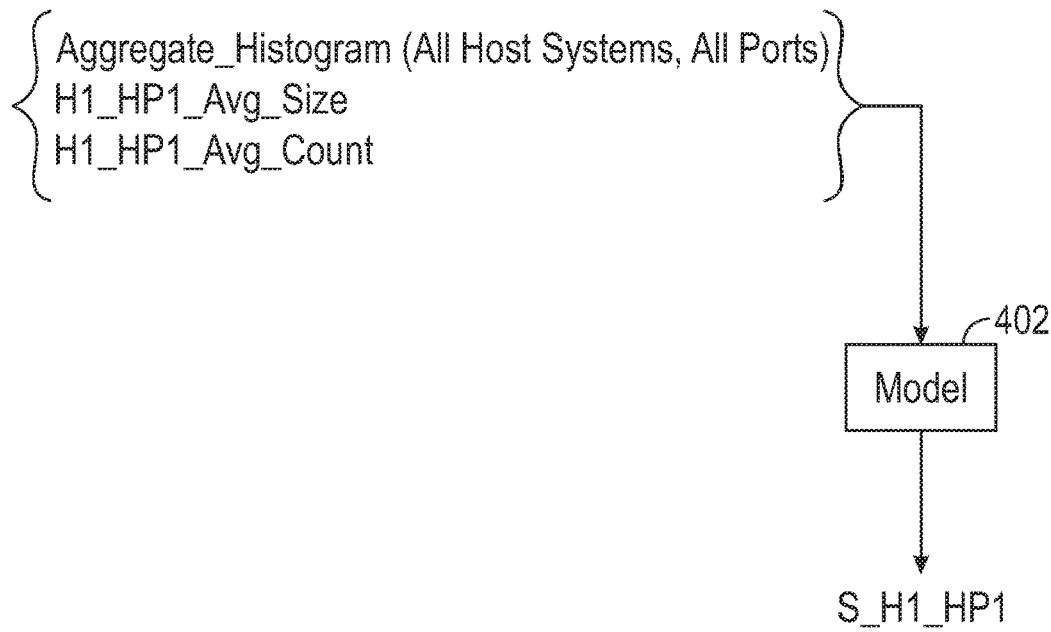

Once the various saturation values S_Hx_Py for all the host systems and all the ports of the host systems are computed by the model 400 based on respective histograms, the computed saturation values can be used as facts in training data for training another model 402 shown in FIG. 4B for computing S_Hx_HPy values based on an aggregate histogram and aggregate I/O size and aggregate I/O count. Specifically, as shown in FIG. 4B, to compute the saturation value S_H1_HP1 for port P1 of the host system H1 using the model 402, the following are provided as inputs into the model 402: Aggregate_Histogram(All Host Systems, All Ports), H1_P1_Avg_Size, and H1_P1_Avg_Count.

Aggregate_Histogram(All Host Systems, All Ports) is an aggregate histogram that combines histograms of all host systems and all ports. For example, the aggregate histogram can be an average of Histogram(H1, HP1), Histogram(H1, HP2), . . . , Histogram(H2, HP1), . . . Histogram(HN, P1), . . . , where Histogram(H1, HP1) is the histogram for host port HP1 in host system H1, Histogram(H1, HP2) is the histogram for host port HP2 in host system H1, Histogram (H2, HP1) is the histogram for host port HP1 in host system H2, and Histogram(HN, P1) is the histogram for host port HP1 in host system HN.

H1_HP1_Avg_Size represents the average I/O size of I/O operations of the host system at host port P1, and H1_hP1_Avg_Count represents the average count of I/O operations of the host system H1 at host port P1.

The model 402 is thus able to compute the saturation level of a specific port of a specific host system based on an aggregate histogram of all host systems and all ports, an aggregate I/O size (e.g., H1_HP1_Avg_Size), and an aggregate count of I/O operations (e.g., H1_HP1_Avg_Count).

Effectively, the model 402 is able to predict a saturation level of a specific port of a specific host system given an aggregate histogram that is based on histograms of multiple host systems and multiple ports.

In accordance implementations of the present disclosure, the model 402 (which is an example of the model 122 of FIG. 1) can be used to predict the saturation level of a shared resource contributed by a specific VM.

Figure 4C:
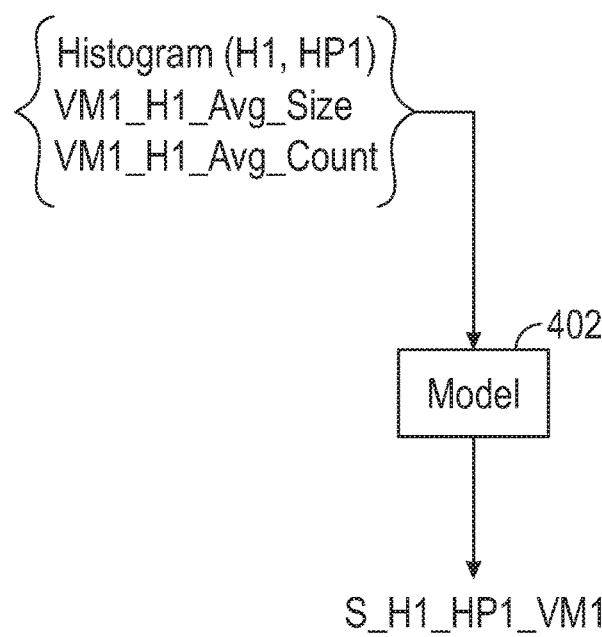

FIG. 4C shows an example of using the histogram for host system H1 and host port HP1, Histogram(H1, HP1), VM1_H1_Avg_Size (which represents the average I/O size of I/O operations of VM1 in host system H1), and VM1_H1_Avg_Count (which represents the average count of I/O operations of VM1 in host system H1) as inputs to the model 402. Based on these inputs shown in FIG. 4C, the model 402 produces a saturation value S_H1_HP1_VM1, which represents the saturation level of a shared resource within the storage system 110 due to VM1's I/O operations provided through host port P1 of host system H1.

Since it is likely that VM1 may drive its I/O operations across the multiple host ports of the host system H1, the model 402 can be used to produce multiple saturation values, such as S_H1_HP1_VM1, S_H1_HP2_VM1, and so forth, for the multiple ports of host system H1. The saturation value S_H1_HP2_VM1 represents the saturation level of the shared resource within the storage system 110 due to VM1's I/O operations provided through host port P2 of host system H1.

The multiple saturation values S_H1_HP1_VM1, S_H1_HP2_VM1, etc., computed using the model 402 for respective multiple ports of the host system H1 can be aggregated (e.g., summed, averaged, etc.) to produce a saturation value representing the saturation of the shared resource due to I/O operations of VM1 in the host system H1.

Figure 5:
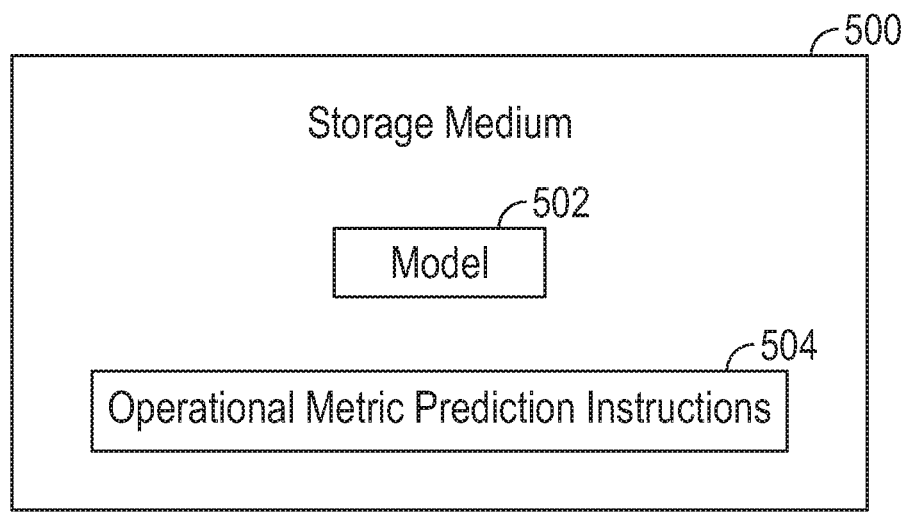
FIG. 5 is a block diagram of a storage medium storing machine-readable instructions according to some examples.

FIG. 5 is a block diagram of a non-transitory machine-readable or computer-readable storage medium 500 storing machine-readable instructions that upon execution cause a system to perform various tasks. The storage medium 500 stores a model 502, such as the model 122 of FIG. 1 or 402 of FIG. 4C, that is generated from an aggregation of parameter values for a plurality of host systems.

The machine-readable instructions stored in the storage medium 500 include operational metric prediction instructions 504 to predict, using the model 502, an operational metric representing usage or performance of a shared resource due to a requester in a first host system of the plurality of host systems, the shared resource being outside of the plurality of host systems.

The requester is one of a plurality of requesters in the first host system, and the aggregation of parameter values is based on parameter values from each of the plurality of requesters in the host system.

In some examples, a respective collection (e.g., a histogram) of buckets representing I/O operations of different characteristics is associated with each corresponding host system of the plurality of host systems, and the model 502 is generated further based on an aggregation of the collections of buckets representing I/O operations associated with the corresponding host systems.

Figure 6:
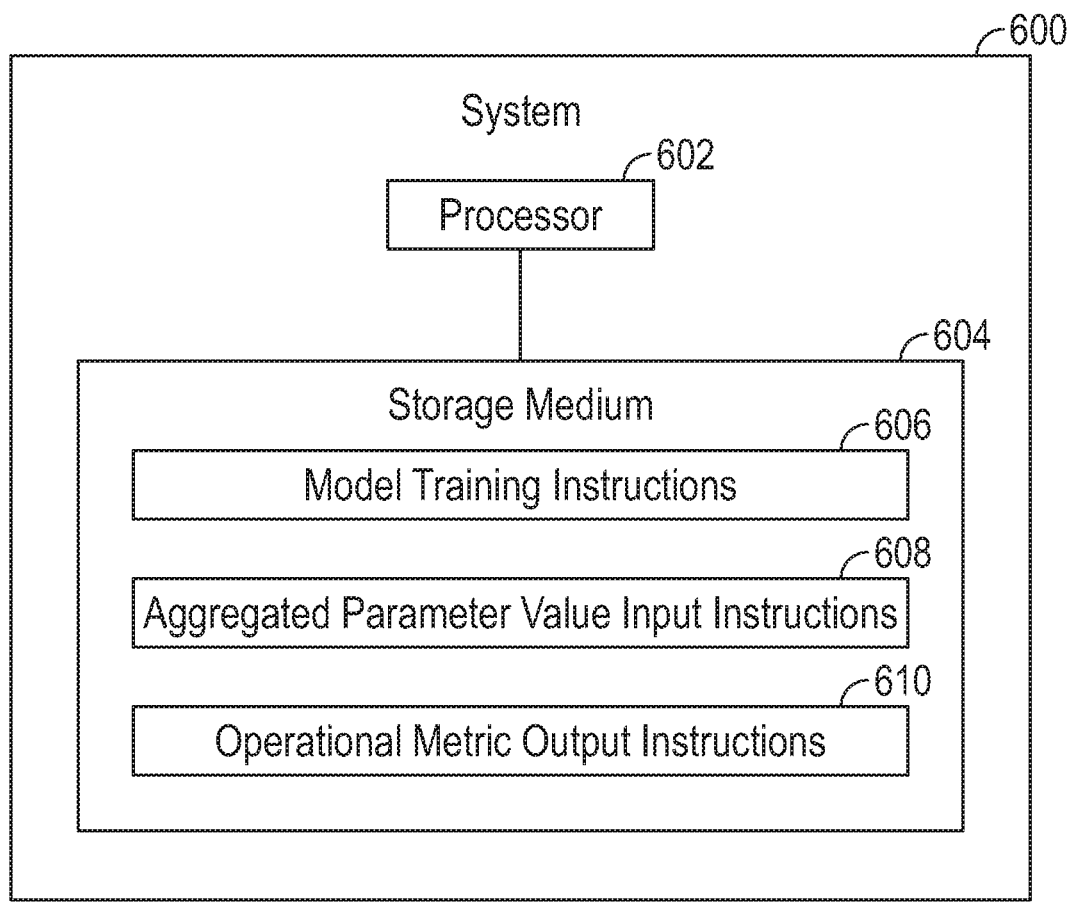
FIG. 6 is a block diagram of a system according to some examples.

FIG. 6 is a block diagram of a system 600, which can be implemented with a computer or multiple computers.

The system 600 includes a hardware processor 602 (or multiple hardware processors). A hardware processor can include a microprocessor, a core of a multi-core microprocessor, a microcontroller, a programmable integrated circuit, a programmable gate array, a digital signal processor, or another hardware processing circuit.

The system 600 further includes a storage medium 604 storing machine-readable instructions executable on the hardware processor 602 to perform various tasks. Machine-readable instructions executable on a hardware processor can refer to the instructions executable on a single hardware processor or the instructions executable on multiple hardware processors.

The machine-readable instructions including model training instructions 606 to train a model using an aggregation of parameter values for a plurality of host systems. The machine-readable instructions further include aggregated parameter value input instructions 608 to input, to the trained model, an aggregated parameter value for a requester in a first host system of the plurality of host systems.

The machine-readable instructions further include operational metric output instructions 610 to, responsive to the inputting of the aggregated parameter value for the requester, output, by the trained model, an operational metric representing usage or performance of a shared resource due to the requester, the shared resource being outside of the plurality of host systems.

Figure 7:
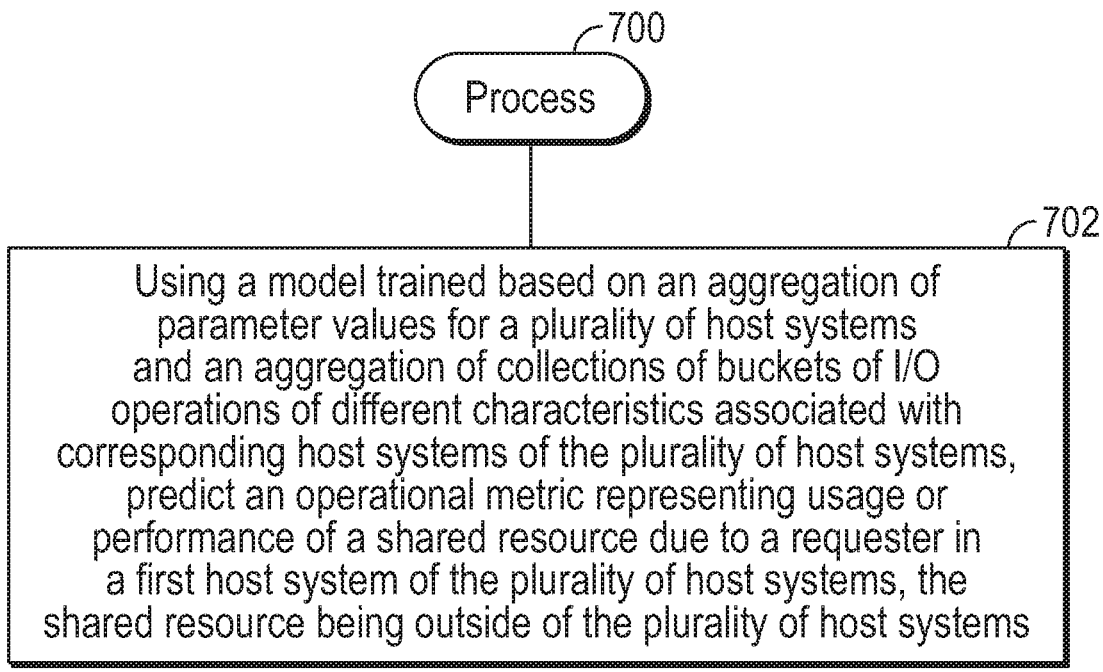
FIG. 7 is a flow diagram of a process according to some examples.

FIG. 7 is a flow diagram of a process 700 that can be performed by the operational metric computation engine 120, for example.

The process 700 includes using a model trained based on an aggregation of parameter values for a plurality of host systems and an aggregation of collections of buckets of I/O operations of different characteristics associated with corresponding host system of the plurality of host systems, predicting (at 702) an operational metric representing usage or performance of a shared resource due to a requester in a first host system of the plurality of host systems, the shared resource being outside of the plurality of host systems.

A storage medium (e.g., 500 in FIG. 5 or 604 in FIG. 6) can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disc (CD) or a digital video disc (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A non-transitory machine-readable storage medium comprising instructions that upon execution cause a system to:

access a model generated from training data comprising an aggregation of parameter values for a plurality of host systems, the parameter values representing different characteristics of input/output (I/O) operations, wherein the aggregation of parameter values comprises an aggregate of sizes of I/O operations of the plurality of host systems, and an aggregate of counts of I/O operations of the sizes of the plurality of host systems;

input, to the model, parameter values representing characteristics of I/O operations in a first host system of the plurality of host systems, and an aggregated parameter value representing a characteristic of I/O operations of a requester in the first host system;

predict, by the model responsive to the input of the parameter values representing the characteristics of I/O operations in the first host system and the aggregated parameter value representing the characteristic of I/O operations of the requester in the first host system, an operational metric representing usage or performance of a shared resource due to the requester in the first host system, the shared resource being outside of the plurality of host systems; and perform a resource management action based on the predicted operational metric.

2. The non-transitory machine-readable storage medium of claim 1, wherein the requester is one of a plurality of requesters in the first host system, and the aggregation of parameter values is based on parameter values from each of the plurality of requesters in the first host system.

3. The non-transitory machine-readable storage medium of claim 1, wherein the requester is selected from among a virtual machine in the first host system, a storage volume in the first host system, or a program in the first host system.

4. The non-transitory machine-readable storage medium of claim 1, wherein the shared resource comprises a resource within a storage system, a port of the storage system, or a communication path between the storage system and the first host system.

5. The non-transitory machine-readable storage medium of claim 4, wherein the resource within the storage system is selected from among a processing resource, a memory resource, or a communication resource.

6. The non-transitory machine-readable storage medium of claim 1, wherein a respective collection of buckets representing I/O operations of different characteristics is associated with each corresponding host system of the plurality of host systems, and the model is generated further based on an aggregation of the collections of buckets representing I/O operations associated with the corresponding host systems.

7. The non-transitory machine-readable storage medium of claim 1, wherein the aggregated parameter value representing the characteristic of I/O operations of the requester in the first host system is based on a mathematical aggregate of different parameter values representing the characteristic of I/O operations of the requester in the first host system.

8. The non-transitory machine-readable storage medium of claim 7, wherein the aggregated parameter value for the requester comprises an aggregate of different sizes of I/O operations of the requester.

9. The non-transitory machine-readable storage medium of claim 1, wherein the requester is a first requester, and the plurality of host systems comprise a second requester, and wherein the instructions upon execution cause the system to:

generate a visualization based on operational metrics representing usage or performance of the shared resource due to the first and second requesters, the operational metrics computed using the model.

10. The non-transitory machine-readable storage medium of claim 9, wherein the visualization includes visual indicators having respective characteristics based on the operational metrics for the first and second requesters.

11. The non-transitory machine-readable storage medium of claim 1, wherein the shared resource is within a storage system, and the operational metric represents the usage or performance of the shared resource due to I/O operations at a first port of the storage system for the requester, and wherein the instructions upon execution cause the system to:

using the model, predict an operational metric representing the usage or performance of the shared resource due to I/O operations at a second port of the storage system for the requester; and aggregate the operational metric due to the I/O operations at the first port, and the operational metric due to the I/O operations at the second port, to produce an aggregated operational metric that represents an overall usage or performance of the shared resource due to the requester.

12. A system comprising:

a processor; and a non-transitory storage medium storing instructions executable on the processor to:

train a model using an aggregation of parameter values for a plurality of host systems, the parameter values representing different characteristics of input/output (I/O) operations, wherein the aggregation of parameter values comprises an aggregate of sizes of I/O operations of the plurality of host systems, and an aggregate of counts of I/O operations of the sizes of the plurality of host systems, input, to the trained model, parameter values representing characteristics of I/O operations in a first host system of the plurality of host systems, and an aggregated parameter value representing a characteristic of I/O operations of a requester in the first host system, the aggregated parameter value representing the characteristic of I/O operations of the requester in the first host system being based on a mathematical aggregate of different parameter values representing the characteristic of I/O operations of the requester in the first host system, responsive to the inputting of the parameter values representing the characteristics of I/O operations in the first host system and the aggregated parameter value representing the characteristic of I/O operations of the requester, output, by the trained model, an operational metric representing usage or performance of a shared resource due to the requester, the shared resource being outside of the plurality of host systems, and perform a resource management action based on the operational metric.

13. The system of claim 12, wherein a respective collection of buckets representing I/O operations of different characteristics is associated with each corresponding host system of the plurality of host systems, and the instructions are executable on the processor to train the model further based on an aggregation of the collections of buckets representing I/O operations associated with the corresponding host systems.

14. The system of claim 12, wherein the requester is a first requester, and the plurality of host systems comprise a second requester, and wherein the instructions are executable on the processor to:

generate a visualization based on operational metrics representing usage or performance of the shared resource due to the first and second requesters, the operational metrics output by the trained model.

15. The system of claim 14, wherein the shared resource is a first shared resource, and wherein the instructions are executable on the processor to:

generate a further visualization based on operational metrics, output by the trained model, representing usage or performance of a second shared resource due to the first and second requesters.

16. A method performed by a system comprising a hardware processor, comprising:

accessing a model generated from training data comprising an aggregation of parameter values for a plurality of host systems, the parameter values representing different characteristics of input/output (I/O) operations, wherein the aggregation of parameter values comprises an aggregate of sizes of I/O operations of the plurality of host systems, and an aggregate of counts of I/O operations of the sizes of the plurality of host systems;

inputting, to the model, parameter values representing characteristics of I/O operations in a first host system of the plurality of host systems, and an aggregated parameter value representing a characteristic of I/O operations of a requester in the first host system;

predicting, by the model responsive to the input of the parameter values representing the characteristics of I/O operations in the first host system and the aggregated parameter value representing the characteristic of I/O operations of the requester in the first host system, an operational metric representing usage or performance of a shared resource due to the requester in the first host system, the shared resource being outside of the plurality of host systems; and performing a resource management action based on the predicted operational metric.

17. The method of claim 16, wherein the requester is one of a plurality of requesters in the first host system, and the aggregation of parameter values is based on parameter values from each of the plurality of requesters in the first host system.

18. The method of claim 16, wherein the requester is a first requester, and the plurality of host systems comprise a second requester, and wherein the method further comprises:

generating a visualization based on operational metrics representing usage or performance of the shared resource due to the first and second requesters, the operational metrics computed using the model.

* * * * *